(12) United States Patent
Letertre et al.

(10) Patent No.: US 7,265,029 B2
(45) Date of Patent: Sep. 4, 2007

(54) FABRICATION OF SUBSTRATES WITH A USEFUL LAYER OF MONOCRYSTALLINE SEMICONDUCTOR MATERIAL

(75) Inventors: Fabrice Letertre, Grenoble (FR); Bruno Ghyselen, Seyssinet-Pariset (FR); Olivier Rayssac, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 494 days.

(21) Appl. No.: 10/883,437

(22) Filed: Jul. 1, 2004

(65) Prior Publication Data

US 2004/0235268 A1    Nov. 25, 2004

Related U.S. Application Data

(63) Continuation of application No. 10/458,471, filed on Jun. 9, 2003, now abandoned, and a continuation-in-part of application No. 10/446,605, filed on May 27, 2003, now Pat. No. 6,794,276, which is a continuation of application No. PCT/FR01/03714, filed on Nov. 26, 2001.

(51) Int. Cl.
*H01L 21/30* (2006.01)

(52) U.S. Cl. .................. 438/458; 438/459; 438/967

(58) Field of Classification Search .................. None
See application file for complete search history.

(56) References Cited

U.S. PATENT DOCUMENTS

| | | | | |
|---|---|---|---|---|
| 5,229,305 A * | 7/1993 | Baker | .......................... | 438/459 |
| 5,374,564 A | 12/1994 | Bruel | .......................... | 437/24 |
| 5,759,908 A | 6/1998 | Steckl et al. | ................. | 438/479 |
| 5,877,070 A | 3/1999 | Goesele et al. | ............. | 438/458 |
| 5,880,491 A | 3/1999 | Soref et al. | ................. | 257/190 |
| 6,020,252 A * | 2/2000 | Aspar et al. | ................. | 438/458 |
| 6,103,597 A * | 8/2000 | Aspar et al. | ................. | 438/458 |

(Continued)

FOREIGN PATENT DOCUMENTS

FR        2681472        3/1993

(Continued)

OTHER PUBLICATIONS

Hobart et al., XP 002174444, "Transfer of ultrathin silicon layers to polycrystalline SiC substrates for the growth of 3C-SiC epitaxial films" Journal of the Electrochemical Society, vol. 146, No. 10, pp. 3833-3836 (1999).

(Continued)

*Primary Examiner*—David E. Graybill
(74) *Attorney, Agent, or Firm*—Winston & Strawn LLP

(57) ABSTRACT

Methods for fabricating a semiconductor substrate. In an embodiment, the technique includes providing an intermediate support, providing a nucleation layer, and providing at least one bonding layer between the intermediate support and the nucleation layer to improve the bonding energy therebetween, and to form an intermediate assembly. The method also includes providing at least one layer of a semiconductor material upon the nucleation layer, bonding a target substrate to the deposited semiconductor material to form a final support assembly comprising the target substrate, the deposited semiconductor material, and the intermediate assembly, and processing the final support assembly to remove the intermediate assembly. The result is a semiconductor substrate that includes the at least one layer of semiconductor material on the target substrate.

33 Claims, 2 Drawing Sheets

U.S. PATENT DOCUMENTS

Figure 1E:
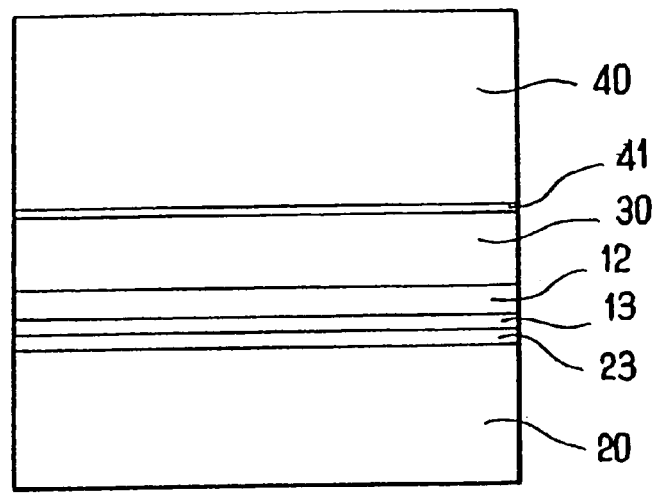

| | | |
|---|---|---|
| 6,114,188 A * | 9/2000 | Oliver et al. ............... 438/107 |
| 6,190,998 B1 * | 2/2001 | Bruel et al. ................. 438/407 |
| 6,225,192 B1 * | 5/2001 | Aspar et al. ............... 438/460 |
| 6,303,468 B1 * | 10/2001 | Aspar et al. ................ 438/455 |
| 6,328,796 B1 | 12/2001 | Kub et al. .................... 117/94 |
| 6,756,286 B1 * | 6/2004 | Moriceau et al. ........... 438/459 |
| 6,794,276 B2 * | 9/2004 | Letertre et al. ............. 438/506 |
| 7,029,993 B1 * | 4/2006 | Barge et al. ................ 438/475 |
| 2005/0266626 A1 * | 12/2005 | Faure et al. ................ 438/197 |

FOREIGN PATENT DOCUMENTS

| | | |
|---|---|---|
| FR | 2774214 | 7/1999 |
| FR | 2787919 | 6/2000 |
| WO | WO 00/44966 A1 | 8/2000 |
| WO | WO 02/37556 A1 | 5/2002 |
| WO | WO 02/43112 A1 | 5/2002 |

OTHER PUBLICATIONS

Mackenzie et al., "Growth of III-Nitrides on ZnO, LiGaO$_2$, and LiAlO$_2$ substrates," J. Electrochem. Soc., vol. 145, No. 7, Jul. 1998, pp. 2581-2584.

Oda et al., "GaN bulk substrates for GaN based LEDs and LDs," Phys. Stat. Sol., (a) vol. 180, 2000, pp. 51-58.

Popovici et al., "Impurity contamination of GaN epitaxial films from the sapphire, SiC, and ZnO substrates," Appl. Phys. Lett., vol. 71, No. 23, Dec. 8, 1997-pp. 3385-3387.

Motoki et al., "Preparation of large freestanding GaN substrates by Hydride Vapor Phase Epitaxy using GaAs as a starting substrate," Jpn. J. Appl. Phys., vol. 41 2001, pp. 140-143.

M. Bruel, "Silicon On Insulator Material Technolgy", Electronics Letters, vol. 31, No. 14, pp. 1201-1202 (1996).

A.J. Steckl et al., "Growth and Charaterization of GaN thin Films on SiC SOI Substrates", Journal of Electronic Materials, vol. 26, No. 3, pp. 217-223 (1997).

* cited by examiner

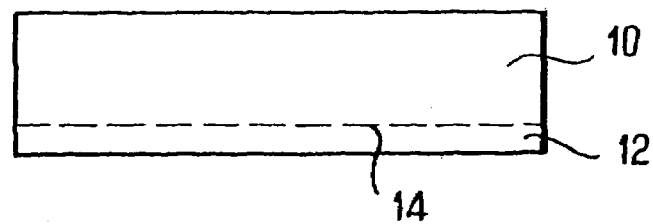
FIG._1A
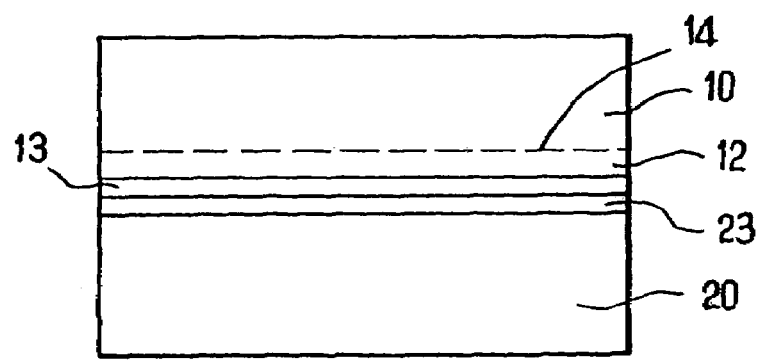
FIG._1B
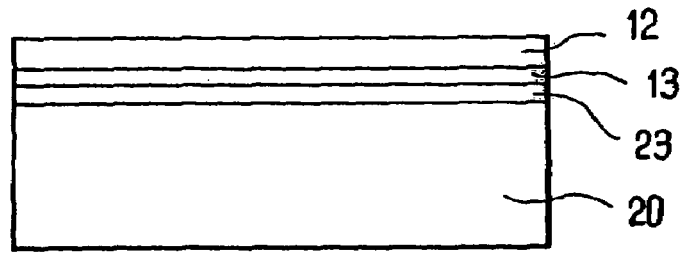
FIG._1C
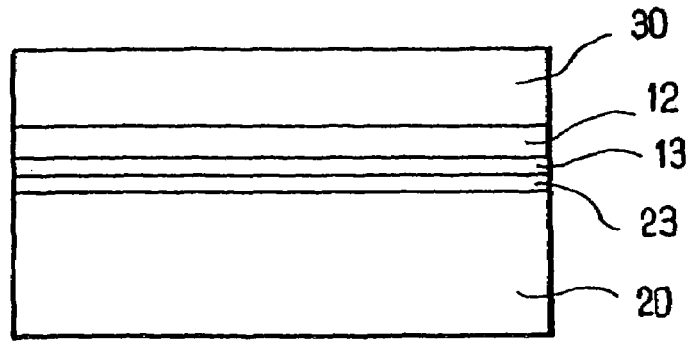
FIG._1D

FABRICATION OF SUBSTRATES WITH A USEFUL LAYER OF MONOCRYSTALLINE SEMICONDUCTOR MATERIAL

CROSS-REFERENCE TO RELATED APPLICATIONS

This application is a continuation of U.S. application Ser. No. 10/458,471 filed on Jun. 9, 2003 now abandoned, and is a continuation-in-part of U.S. application Ser. No. 10/446,605, filed on May 27, 2003 now U.S. Pat. No. 6,794,276, which is a continuation of International Application PCT/FR01/03714 filed Nov. 26, 2001, the entire contents of each of which are expressly incorporated herein by reference thereto.

FIELD OF INVENTION

The present invention relates to methods of fabricating a semiconductor substrate. In an embodiment, the semiconductor substrate includes at least one layer of monocrystalline semiconductor material, especially a wide band gap material, and in particular a mono or poly-metallic nitride substrate, such as gallium nitride (GaN) or aluminum nitride (AlN), or a diamond substrate, on a target substrate.

BACKGROUND OF THE INVENTION

Semiconductor technology based on the use of GaN, AlN, and compounds thereof as semiconductor material, currently suffer from a lack of large-sized bulk substrates of such materials.

The most widely known technique for producing a bulk GaN substrate consists of depositing the GaN on a substrate by a process known as hetero-epitaxy.

In order to produce a substrate having good crystal quality, the substrate material and the epitaxial monocrystal to be deposited thereon, must have little lattice mismatch. Additionally, the thermal expansion coefficient of both the substrate material and the epitaxial monocrystal must be relatively similar, because the high temperatures involved in hetero-epitaxy is known to sometimes cause dissociation and diffusion of elements of the substrate to the epitaxial layer. Thirdly, the substrate material must be mechanically and chemically stable at high temperatures so as to obtain good crystal quality. Naturally, qualities such as surface condition and crystal quality of the starting substrate are also important factors.

Currently, sapphire and silicon carbide (SiC), are commonly used as the substrate material. However, sapphire and silicon carbide are far from being optimal substrate material due to their lattice parameters and their expansion coefficients.

Another common practice is growing layers of GaN on substrates such as zirconium oxide (ZnO), lithium gallium oxide (LiGaO$_2$), lithium aluminum oxide (LiAlO$_2$) (See "Growth of III-Nitrides on ZnO, LiGaO$_2$ and LiAlO$_2$ substrates", Mackenzie et al., J. Electrochem. Soc., vol. 145, N° 7, July 1998, p. 2581) or of neodymium gallium oxide (NdGaO$_3$) (see "GaN bulk substrates for GaN based LEDs and LDs", Oda et al., Phys. Stat. Sol., (a) 180, 51 (2000). Although these substrate materials are often selected for their small lattice mismatch and their similar coefficient of expansion with GaN, they suffer from having poor chemical stability under high temperatures as compared to sapphire or silicon carbide. For example, when the oxide substrates are exposed to high temperatures, dissociation of the metal and/or the oxygen occurs and such dissociated metal and/or oxygen diffuses to the epitaxial layer. As described in *Impurity contamination of GaN epitaxial films from the sapphire, SiC, and ZnO substrates*, Popovici et al., Appl. Phys. Lett., 71(23), 8 Dec. 1997, and incorporated herein, contamination of the epitaxial layer by zinc and oxygen from a ZnO substrate compromises the quality and purity of the epitaxial layer.

Furthermore, once the layer or layers intended to form the substrate have been formed, in the majority of cases the support on which growth has been carried out has to be removed, which necessitates either chemical attack of said support and thus its loss even if it is produced from an expensive material, thereby increasing the cost of the process, or by rupture between the layers formed by epitaxial growth and said support, which can be difficult to control and/or can necessitate particular dispositions which complicate the method or make it more expensive.

More generally, it has been proven that, for the purpose of temporary support removal, chip manufacturers mostly prefer an etching technique rather than a rupturing technique. This is mainly because, in the semiconductor industry, etching techniques have been mastered for years and most often do not require any additional investment while rupture techniques are more difficult to control or require significant capital investment, thus adding complexity to the process.

In parallel, an etching approach would be valuable only if the material of the support is relatively inexpensive, but such inexpensive materials, such as gallium Arsenide GaAs, introduce additional drawbacks. In this regard, the article "Preparation of large freestanding GaN substrates by Hydride Vapor Phase Epitaxy using GaAs as a starting substrate", Motoki et al., Jpn. J. Appl. Phys., Vol. 41 (2001), p. 140-143, proposes using a gallium arsenide GaAs substrate on which to grow GaN by hetero-epitaxy. However, when heated to the high temperatures involved in epitaxy, GaAs undergoes surface dissociation, which causes arsenic to evaporate, which can contaminate the GaN monocrystal.

The present invention now seeks to overcome these disadvantages.

SUMMARY OF THE INVENTION

The invention relates to methods for fabricating a semiconductor substrate. In an implementation, the method includes providing an intermediate support, providing a nucleation layer, and providing at least one bonding layer between the intermediate support and the nucleation layer to improve the bonding energy therebetween, and to form an intermediate assembly. The technique also includes providing at least one layer of a semiconductor material upon the nucleation layer, bonding a target substrate to the deposited semiconductor material to form a support assembly that includes the target substrate, the deposited semiconductor material, and the intermediate assembly, and then processing the support assembly to remove the intermediate assembly. The result is a semiconductor substrate that includes the at least one layer of semiconductor material on the target substrate.

Preferably, the nucleation layer functions as a barrier layer against diffusion of atoms from the intermediate support at epitaxial growth temperatures, and the semiconductor material layer is epitaxially deposited on the nucleation layer. If desired, a second barrier layer may be provided between the nucleation layer and the intermediate support prior to epitaxially depositing the semiconductor material layer. In an advantageous embodiment, the intermediate support includes a barrier layer that is resistant to diffusing elements derived from dissociation of the intermediate support at epitaxial growth temperatures, and the semiconductor material is epitaxially deposited on the nucleation layer. The barrier layer may be formed by a deposition technique, and in an implementation, the barrier layer is first applied to the intermediate support and then the nucleation layer is applied to the barrier layer. A layer of adhesive may be applied to at least one of a surface of the barrier layer or a surface of the nucleation layer to define a bonding layer.

The intermediate assembly is advantageously provided by implanting atomic species into at least a portion of a source substrate to define the nucleation layer, wherein a main concentration of implanted atomic species defines a detachment zone, applying the at least one bonding layer to at least one of a surface of the nucleation layer or to at least a portion of a surface of the intermediate support, attaching the source substrate implanted with the atomic species, the at least one bonding layer, and at least a portion of the intermediate support together to form a structure, and treating the structure to detach the intermediate assembly from the source substrate at the detachment zone.

According to this aspect of the invention, the intermediate support is preferably selected from the group consisting of silicon, gallium arsenide, zinc oxide, lithium gallium oxide and lithium aluminum oxide. In addition, the nucleation layer may include at least one of silicon carbide, gallium nitride, or sapphire. The semiconductor material also preferably is made of at least one of a mono or poly-metallic nitride, and in particular gallium nitride. The nucleation layer is preferably selected from the group consisting of silicon carbide, gallium nitride and sapphire. If desired, the final support assembly may further include a reflective coating.

Preferably, the at least one bonding layer is made of at least one of silicon oxide or silicon nitride. The target substrate may be made of at least one of monocrystalline or polycrystalline silicon. Advantageously, the final support is chemically treated to remove at least one of the intermediate support or the nucleation layer.

Another aspect of a method for fabricating a semiconductor substrate according to the invention includes transferring a seed layer on to a support substrate, depositing a working layer on the seed layer to form a composite substrate, and detaching the seed layer and the working layer from the composite substrate to form the semiconductor substrate. In this implementation, the material of the seed layer is suitable for accommodating the thermal expansion of the support substrate and the thermal expansion of the working layer.

Preferably, the support substrate comprises a material having thermal expansion coefficients that minimize stresses that arise during variations in temperature. Advantageously, the seed layer is transferred onto the support layer by molecular adhesion. In an implementation, the seed layer and the working layer are detached from the composite substrate by the application of stress at the adhesion interface, wherein the stress is selected from the group consisting of mechanical stress, thermal stress, electrostatic stress and laser irradiation stress, or a combination thereof.

In an implementation, the working layer is made of gallium nitride. In addition, the seed layer may be made of a material from the group consisting of sapphire, silicon carbide, zinc oxide, silicon, gallium nitride, neodymium gallate, and lithium gallate. The support layer may be made of a material selected from the group consisting of silicon carbide, aluminum nitride, silicon, and sapphire. Advantageously, the seed layer and the support layer have substantially the same chemical composition.

In a beneficial embodiment, the method further includes applying an intermediate layer between the seed layer and the support. The intermediate layer may be at least one of a bonding layer or an insulating layer.

Preferably, the seed layer includes a crystal lattice parameter sufficient for the epitaxial growth of the working layer on the seed layer such that the working layer has a dislocation concentration less than about $10^7/cm^2$. An advantageous implementation includes providing a source substrate including the seed layer and a weakened zone, and detaching the seed layer from the source substrate at the weakened zone. In this embodiment, the weakened zone includes implanted atomic species at a depth that corresponds to the thickness of the source substrate, and the seed layer may be detached from the source substrate by application of at least one of heat treatment, mechanical stress, chemical etching, or a combination thereof.

The method according to this aspect of the invention preferably further includes preparing the seed layer to receive the working layer, wherein the preparation includes at least one of polishing, annealing, smoothing, oxidation, and etching. The method may also advantageously include removing the support substrate such that it remains in a condition sufficient for recycling and reuse.

BRIEF DESCRIPTION OF THE DRAWING FIGURES

Figure 1F:
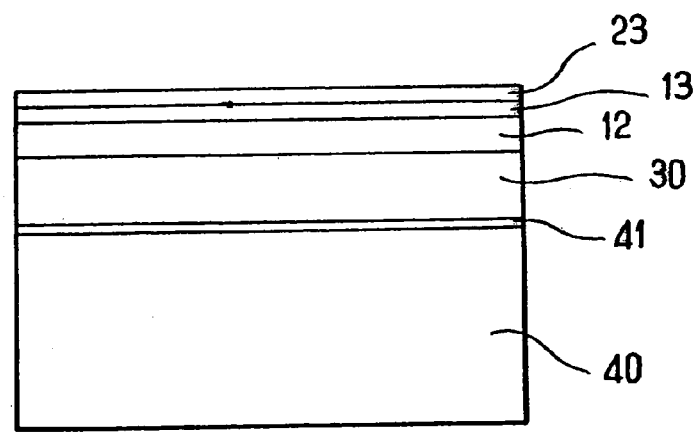
Figure 1G:
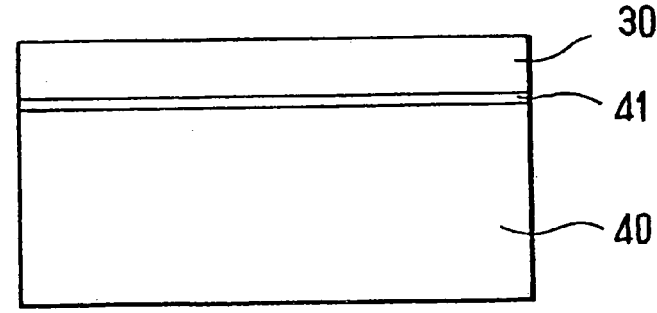

Other aspects, aims and advantages of the present invention become clear from the following description of a preferred implementation, given by way of non-limiting example and made with reference to the accompanying drawings in which:

FIGS. 1A to 1G illustrate the successive steps of a method in accordance with the invention.

DETAILED DESCRIPTION OF THE PREFERRED EMBODIMENTS

The present invention preferably provides a method for fabricating a substrate by hetero-epitaxial growth wherein the epitaxial layer(s) is protected against contamination from the substrate material despite exposure to the high temperatures necessary for growth. The invention also provides a method for easy removal of the support on which the epitaxial layer is grown.

Generally, the intermediate support is a material that can be chemically attacked by a given attack medium, so that it is preferable for the material of the nucleation layer to be one that forms a barrier against diffusion of elements deriving from any thermal dissociation of the intermediate support material.

In one specific arrangement, the method involves epitaxial growing of the monocrystalline semiconductor material on the nucleation layer. Preferably, monocrystalline semiconductor material is deposited on the nucleation layer by epitaxy. However, other methods are suitable, as is known in the art.

As noted above, the material of the intermediate support is one that can be chemically attacked or etched by a given etching medium, it is subject to thermal dissociation when exposed to a the temperature of epitaxial growing of the semiconductor layer, and is made of a material that is less expensive than materials that are more resistant to thermal dissociation at epitaxial growth temperatures.

Referring to FIGS. 1A to 1G, FIG. 1A shows a source substrate 10, such as monocrystalline silicon carbide SiC, in which ions, e.g., hydrogen ions, have been implanted at a certain depth using an ionic bombardment machine, a plasma implantation machine, or any other known method in the art. The implantation of ions defines a nucleation layer or seed layer 12 of implanted ions on a portion of the source substrate 10, wherein the main concentration of ions on the source substrate define a detachment zone or weakened zone 14. Typically, ions are implanted to a depth in the range of about 200 nanometers (nm) to 1000 nm, using ions with energy in the range of about 50 kilo electron volts (keV) to 200 keV, and an implantation dose in the range of about $5 \times 10^{16}$ ions per square centimeter (ions/cm$^2$) to $1 \times 10^{17}$ ions/cm$^2$.

Referring to FIG. 1B, substrate 10 having layer 12 is attached to an intermediate growth support substrate 20 by molecular bonding to form a source substrate-intermediate growth support substrate assembly. For example, the growth support substrate 20 may comprise monocrystalline gallium arsenide GaAs. Typically, the intermediate growth support substrate 20 has a thickness in the range of about 400 micrometers (µm) to 800 µm.

Optionally, at least one surface of source substrate 10 and/or support substrate 20 is provided with bonding layers 13, 23 in a manner known in the art. Such bonding layers may be silicon oxide $SiO_2$ or silicon nitride $Si_3N_4$. However, other materials may be used as known in the art. When formed from $SiO_2$ on Si, the bonding layer(s) are provided on the surface of the source substrate or the intermediate support substrate by thermal oxidation, or alternatively, by deposition. The bonding energy of the bonding interface is brought to the required level by heat treatment, typically at a temperature of more than about 300° C. for a period that is typically 2 hours. However, other known methods may be used.

Stresses, such as thermal and/or mechanical, but which could be of some other nature, are applied to the source substrate-intermediate growth support substrate assembly so as to detach the intermediate growth support substrate 20 and the nucleation layer or seed layer 12 from the remaining source substrate 10, at the detachment zone 14. Such detachment can be accomplished using the known Smart-Cut® technique developed by Applicant. To this end, a heat treatment is typically carried out at a temperature in the range 800° C. to 900° C. for a period in the range 30 minutes to 3 hours. Such heat treatment can be combined with that used to strengthen the bonding interface.

As illustrated in FIG. 1C, a structure comprising a GaAs growth support 20 having a thin nucleation layer 12 of monocrystalline SiC is obtained. The free surface of said layer can undergo polishing/cleaning and in particular chemical-mechanical polishing or ion beam smoothing intended to allow good-quality epitaxial growth to be performed thereon.

A metal organic chemical vapor deposition (MOCVD) hetero-epitaxy technique is carried out on this surface to produce a stack of deposits of gallium nitride GaN with different types of doping, said technique being known to produce a GaN stack or working layer 30 having good crystal quality.

Such technique is carried out at a temperature of about 1050° C. to 1100° C., at which temperature partial dissociation of the GaAs of the support substrate 20 is observed. The presence of the SiC nucleation layer 12, however, forms a barrier layer against the diffusion of arsenic or gallium atoms towards the deposited layer 30, and thereby maintains the quality of the and the purity of layer 30.

The stack of GaN is typically a few microns thick, i.e., it is a thin layer, as opposed to the thick layers with a minimum thickness of about 200 µm to 300 µm, which renders the stack self-supporting.

FIG. 1D shows the resulting structure.

After growth of the GaN stack 30, the assembly comprising the support substrate layers 20, bonding layer 23, bonding layer 13, implanting layer 12 and layer 30 is applied to a target substrate 40 of monocrystalline or polycrystalline silicon so as to form the final support of the GaN layer.

At its surface receiving the GaN layer, said final support 40 advantageously has metallization 41 allowing the final support to comprise a reflector for visible or UV radiation emitted by the electroluminescent components which have been formed in the layer 30. The metallization 41 of the surface of the final support 40 is preferably achieved by cathode sputtering or vacuum evaporation of gold, tin, or palladium (or of any suitable alloy) with a thickness of 500 nm, for example.

The free surface of the GaN stack 30 undergoes polishing treatment, typically a chemical-mechanical polishing or ion beam smoothing intended to provide a flatness that is suitable for molecular bonding with the target substrate 40, which itself must have satisfactory flatness prior to metallization.

The thickness of substrate 40 is typically in the range of about 300 µm to 500 µm.

Fixing is achieved by molecular bonding or by eutectic bonding (which means that polishing can be dispensed with), if necessary supplying heat energy at a temperature in the range 200° C. to 350° C. for several hours to produce the desired bonding forces.

Optionally, prior to fixing, the GaN stack 30 can undergo all or some treatments for producing components such as blue or green LEDs, laser diodes, etc.

The assembly is exposed to chemical attack with a solution comprising a mixture including HF, $HNO_3$, $CH_3COOH$, and $H_2O$ in proportions of 1:3:3:5 to completely remove the intermediate GaAs support 20.

The nucleation layer, and if appropriate, the bonding layers 13, 23 (if they have not been removed chemically) are removed preferably by ionic etching. Additionally, it is also possible to remove a portion of the epitaxial layers that have been formed, in particular to remove initial epitaxial layers containing defects.

The method described herein with mention of certain examples is not meant to be limiting, and as is known in the art variants are also encompassed within the invention. For instance, the choice of nucleation layer 12 is principally conditioned by the search for a compromise between the lattice parameter, thermal expansion coefficient, stability at high temperatures, ability to form a barrier layer against the diffusion of elements from possible partial decomposition of the layer forming the intermediate support. Preferably, either SiC as indicated above is selected, or GaN, or even sapphire is selected. However, other materials may be used as known in the art.

The material of the intermediate support 20 is not critical as regards to lattice parameter, but it should be selected principally as a result of finding a compromise between its thermal expansion coefficient compared with that of the material of the epitaxial layer, the stability of the epitaxial layer under high temperatures, and in particular the facility with which it is removed chemically.

In addition to GaAs, other materials may be used such as silicon, certain oxides such as ZnO, LiGa$_2$ or NdGaO$_3$. Further, the material deposited by epitaxial growth to form the useful layer or layers of the substrate is typically a stack of differently doped layers of GaN, in a manner that is known in the art. However, it can also be a stack of a variety of other metal nitrides such as AlN or GaAlN, etc.

Finally, the final support 40 can be any support selected as a function of a compromise between its ability to receive the metallization 41 if appropriate, its ability to receive the deposited layer 30 by bonding or any other technique, its properties in terms of mechanical and chemical stability during treatments for producing components in the stack of layers 30, its thermal properties, its fabrication cost, etc.

In another embodiment, not shown in the Figures, comprises two distinct layers deposited on or applied to the intermediate support, one forming a barrier to the diffusion of elements deriving from dissociation of the material of the intermediate support, and the other, outer layer, forming a nucleation layer. It should be noted in this respect that the barrier layer can be formed, deposited or applied either onto the source substrate 10, or onto the intermediate support 20, prior to bonding.

EXAMPLE

A 500 nm thick layer of SiO$_2$ is produced on one face of a monocrystalline SiC source substrate by thermal oxidation. Hydrogen ions are then implanted with an energy of 100 keV and using a dose of $8\times10^{16}$ ions/cm$^2$ into the source substrate using ion bombardment equipment. A 500 μm thick monocrystalline GaAs substrate intended to form the intermediate support is also prepared, and one face of the substrate is coated with a 500 nm thick SiO$_2$ layer by chemical vapor deposition.

Surface activation is then carried out, for example by chemical-mechanical polishing, to smooth the surfaces and provide them with a certain hydrophilic nature. The faces of the source substrate and the intermediate support substrate are then brought together and bonded, and a suitable bonding energy is obtained by heat treatment at 350° C. for a period of 2 hours.

This assembly then undergoes heat treatment at 900° C. for a period of one hour to obtain detachment at the implanted zone. The face of the layer 12 is then polished at the detachment location using ionic smoothing by ion cluster smoothing.

Different GaN layers are then deposited by epitaxial growth. Typically, the GaN stack 30 has the following succession of layers: an 8 nm AlN buffer layer, and a 1 μm GaN layer.

After the operation, the free face of the stack 30 is polished by using an ion cluster technique.

Meanwhile, a monocrystalline silicon substrate with a normal commercial grade of surface polishing and a thickness of 500 μm is coated with a metallization layer based on indium/palladium over a thickness of 400 nm. The intermediate support 20 carrying the stack 30 and the substrate 40 carrying the metallization 41 are then bonded together by molecular bonding, the bonding interface being reinforced by heat treatment at 350° C. for a period of 2 hours. The GaAs intermediate support is then attacked by immersion in an attack solution composed of a mixture of HF, HNO$_3$, CH$_3$COOH, and H$_2$O in proportions of 1:3:3:5, peripheral attack of the metallic layer 41 being minor and without consequence. The attack finishes at the SiC layer 12. This latter layer is then removed, for example by SF$_6$/O$_2$ reactive ionic etching.

In accordance with another aspect of the invention, referring to FIGS. 1A to 1D, the technique includes transferring a nucleation layer or seed layer 12 onto a support substrate 20, depositing a semiconductor layer or working layer 30 on the seed layer 12 to form a composite substrate, and then detaching the seed layer 12 and the working layer 30 from the composite substrate. The seed layer in accordance with this aspect of the invention may comprise material such as sapphire, silicon carbide, zinc oxide, silicon, gallium nitride, neodymium gallate, lithium gallate, or any combination thereof. Also included are other materials commonly known in the art. In an implementation, the seed layer 12 is prepared before receiving the working layer, wherein the preparation may include polishing, annealing, smoothing, oxidation, etching or any combination thereof.

Preferably the seed layer includes a crystal lattice parameter that is sufficient for growing a working layer onto the seed layer, wherein the working layer has a dislocation concentration less than about $10^7$/cm$^2$.

Also in accordance with this aspect of the invention, the source substrate includes a seed layer 12 and a weakened zone 14. In this embodiment, the seed layer 12 is detached from the source substrate 10 at the weakened zone 14, and transferred onto a support substrate 20. The detached seed layer 12 is transferred onto the support substrate 20, for example, by molecular adhesion at an adhesion interface. A working layer 30 is deposited onto the transferred seed layer 12 to form a composite substrate. The seed layer 12 and the working layer 30 are detached from the composite substrate at the adhesion interface.

The depositing step may include depositing the seed layer onto the support substrate by epitaxy. However, other methods as known in the art may be used. Also, the seed layer and the working layer may be detached from the composite substrate by the application of stress.

Optionally, the invention may further include applying a first bonding layer 13 onto the source substrate 10, and applying a second bonding layer 23 onto the support substrate 20. Preferably, the source substrate 10 includes implanted atomic species to a predetermined depth to form a weakened zone 14. The first and second bonding layers 13, 23 may be contacted to attach the source and support substrates, and then the seed layer 12 can be detached from the source substrate 10 at the weakened zone 14 and then transferred onto the support substrate 20. Thereafter, the working layer 30 may be deposited onto the seed layer 12, which has been transferred to the support substrate 20.

Advantageously, the detaching step, as mentioned above, includes applying a stress such as mechanical stresses, thermal stresses, electrostatic stresses, laser irradiation stresses, or a combination thereof. If desired, the support may then be recycled and reused.

The support substrate preferably comprises a material having a coefficient of thermal expansion of about 0.7 to 3 times the coefficient of the working layer, and the seed layer is suitable for accommodating the thermal expansion of the support and of the working layer. Preferably, the values of the thermal expansion coefficients herein relate to those in a plane parallel to the plane of the working layer. Advantageously, the material selected to form the support presents thermal expansion coefficients that reduce or even eliminate significant tension or compression stresses of the kind that arise during the variations in temperature that are inherent when growing the working layer, or that occur when the substrate formed in this manner returns to ambient temperature.

Importantly, tolerance to the differences of the thermal expansion coefficients of the working layer and the support substrate materials, increases when the difference leads to compression in the working layer, as opposed to when it leads to stretching of the layer. Thus, in compression, the thermal expansion coefficient of the support material can be several times greater than that of the working layer. However, during extension of the working layer, the thermal expansion coefficient of the support material is preferably not less than 0.7 times the coefficient of the working layer.

Preferably, the nucleation layer or seed layer is suitable for adapting to the thermal expansions imposed by the support and/or the working layer. For this purpose, the seed layer has a thickness that is small enough to enable it to be deformed so as to accommodate the dimensional variations due to thermal expansion of the support and/or of the working layer. This thickness depends on the seed layer material and on the respective materials of the support and of the working layer. Typically, for a silicon carbide support having thickness of 300 microns ($\mu m$) and a gallium nitride working layer having thickness of several microns, a monocrystalline silicon carbide seed layer should have thickness that is less than 0.5 $\mu m$, and that is preferably less than 1000 angstroms (Å).

Advantageously, as mentioned above, the seed layer material also presents lattice parameters such that the working layer can be epitaxially grown on the seed layer with dislocations in the working layer at a concentration of less than $10^7/cm^2$. The skilled person knows how to perform such epitaxial growth by selecting parameters and orientations both for the seed layer and for the working layer.

Clearly, the present invention is not limited to the preferred implementations described and shown in the drawings, and the skilled person is capable of providing variants and modifications, all of which are included within the scope of the appended claims.

What is claimed is:

1. A method for fabricating a semiconductor substrate, comprising:
   providing an intermediate support;
   providing a nucleation layer;
   providing at least one bonding layer between the intermediate support and the nucleation layer to improve the bonding energy therebetween, and to form an intermediate assembly;
   depositing at least one layer of a semiconductor material upon the nucleation layer;
   bonding a target substrate to the deposited semiconductor material to form a support assembly comprising the target substrate, the deposited semiconductor material, and the intermediate assembly; and
   processing the support assembly to remove the intermediate assembly to provide a semiconductor substrate comprising the at least one layer of semiconductor material on the target substrate.

2. The method of claim 1, wherein the nucleation layer comprises a barrier layer against diffusion of atoms from the intermediate support at epitaxial growth temperatures, and wherein the semiconductor material layer is epitaxially deposited on the nucleation layer.

3. The method of claim 2, which further comprises providing a second barrier layer between the nucleation layer and the intermediate support prior to epitaxially depositing the semiconductor material layer.

4. The method of claim 1, wherein the intermediate support further comprises a barrier layer that is resistant to diffusing elements derived from dissociation of the intermediate support at epitaxial growth temperatures, and wherein the semiconductor material is epitaxially deposited on the nucleation layer.

5. The method of claim 4, wherein the barrier layer is formed by a deposition technique.

6. The method of claim 4, wherein the barrier layer is first applied to the intermediate support and then the nucleation layer is applied to the barrier layer.

7. The method of claim 6, wherein a layer of adhesive is applied to at least one of a surface of the barrier layer or a surface of the nucleation layer to define a bonding layer.

8. The method of claim 1, wherein the nucleation layer is formed by a deposition technique.

9. The method of claim 1, wherein the intermediate assembly is removed by etching.

10. The method of claim 9, wherein the intermediate assembly is etched with an acid solution.

11. The method of claim 1, wherein the intermediate assembly is provided by:
    implanting atomic species into at least a portion of a source substrate to define the nucleation layer, wherein a main concentration of implanted atomic species defines a detachment zone;
    applying the at least one bonding layer to at least one of a surface of the nucleation layer or to at least a portion of a surface of the intermediate support;
    attaching the source substrate implanted with the atomic species, the at least one bonding layer, and at least a portion of the intermediate support together to form a structure; and
    treating the structure to detach the intermediate assembly from the source substrate at the detachment zone.

12. The method of claim 11, wherein the treating step comprises applying thermal or mechanical stress to detach the nucleation layer from the support substrate.

13. The method of claim 11, which further comprises affixing the nucleation layer to the at least one bonding layer and to the intermediate support by molecular bonding.

14. The method of claim 1, wherein the intermediate support is selected from the group consisting of silicon, gallium arsenide, zinc oxide, lithium gallium oxide and lithium aluminum oxide.

15. The method of claim 1, wherein the nucleation layer comprises at least one of silicon carbide, gallium nitride, or sapphire.

16. The method of claim 1, wherein the semiconductor material comprises at least one mono or poly-metallic nitride.

17. The method of claim 16, wherein the semiconductor material layer comprises gallium nitride, and further wherein the nucleation layer is selected from the group consisting of silicon carbide, gallium nitride and sapphire.

18. The method of claim 1, wherein the final support assembly further comprises a reflective coating.

19. The method of claim 1, wherein the at least one bonding layer comprises at least one of silicon oxide or silicon nitride.

20. The method of claim 1, wherein the target substrate comprises at least one of monocrystalline or polycrystalline silicon.

21. The method of claim 1, wherein the final support is chemically treated to remove at least one of the intermediate support or the nucleation layer.

22. The method of claim 1, wherein the material of the nucleation layer is suitable for accommodating the thermal expansion of the intermediate support and the thermal expansion of the deposited semiconductor layer.

23. The method of claim 22, wherein the intermediate support comprises a material having thermal expansion coefficients that minimize stresses that arise during variations in temperature.

24. The method of claim 22, wherein the nucleation layer is gallium nitride.

25. The method of claim 22, wherein the nucleation layer comprises a material from the group consisting of sapphire, silicon carbide, zinc oxide, silicon, gallium nitride, neodymium gallate, and lithium gallate.

26. The method of claim 22, wherein the intermediate support comprises a material from the group consisting of silicon carbide, aluminum nitride, silicon, and sapphire.

27. The method of claim 22, wherein the nucleation layer and the intermediate support have substantially the same chemical composition.

28. The method of claim 22, wherein the nucleation layer includes a crystal lattice parameter sufficient for the epitaxial growth of the working layer on the nucleation layer such that the semiconductor layer has a dislocation concentration less than about $10^7/cm^2$.

29. The method of claim 22, further comprising providing a source substrate including the nucleation layer and a weakened zone, and detaching the nucleation layer from the source substrate at the weakened zone to transfer it to the intermediate support.

30. The method of claim 29, wherein the weakened zone comprises implanted atomic species at a depth that corresponds to the thickness of the source substrate.

31. The method of claim 29, wherein the nucleation layer is detached from the source substrate by application of at least one of heat treatment, mechanical stress, chemical etching, or a combination thereof.

32. The method of claim 22, which further comprises preparing the nucleation layer to receive the semiconductor layer, wherein the preparation includes at least one of polishing, annealing, smoothing, oxidation, and etching.

33. The method of claim 22, further comprising removing the intermediate support such that it remains in a condition sufficient for recycling and reuse.

* * * * *

UNITED STATES PATENT AND TRADEMARK OFFICE
CERTIFICATE OF CORRECTION

PATENT NO. : 7,265,029 B2  Page 1 of 1
APPLICATION NO. : 10/883437
DATED : September 4, 2007
INVENTOR(S) : Letertre et al.

It is certified that error appears in the above-identified patent and that said Letters Patent is hereby corrected as shown below:

Title Page:

Before Item (51), please insert the following:

-- (30)   Foreign Application Priority Data
Jan. 24, 2003    (FR) .......................... 03 00780
Jun. 11, 2002    (FR) .......................... 02 07132
Nov. 27, 2000    (FR) .......................... 00 15279 --

Signed and Sealed this

Tenth Day of February, 2009

JOHN DOLL
*Acting Director of the United States Patent and Trademark Office*